United States Patent [19]
de Frésart et al.

[11] Patent Number: 5,436,180
[45] Date of Patent: Jul. 25, 1995

[54] METHOD FOR REDUCING BASE RESISTANCE IN EPITAXIAL-BASED BIPOLAR TRANSISTOR

[75] Inventors: Edouard D. de Frésart, Tempe; John W. Steele, Chandler; N. David Theodore, Mesa, all of Ariz.

[73] Assignee: Motorola, Inc., Schaumburg, Ill.

[21] Appl. No.: 203,094

[22] Filed: Feb. 28, 1994

[51] Int. Cl.⁶ .......................................... H01L 21/331
[52] U.S. Cl. ........................................ 437/31; 437/99; 437/247; 437/909; 148/DIG. 11
[58] Field of Search ................. 437/89, 90, 99, 31, 437/247, 32, 909; 148/DIG. 10, DIG. 11

[56] References Cited

U.S. PATENT DOCUMENTS

| | | | |
|---|---|---|---|
| 4,504,332 | 3/1985 | Shinada | 437/99 |
| 4,879,255 | 11/1989 | Deguchi et al. | 437/59 |
| 4,914,053 | 4/1990 | Matyi et al. | 437/90 |

FOREIGN PATENT DOCUMENTS

| | | | |
|---|---|---|---|
| 0001225 | 1/1982 | Japan | 437/89 |
| 0031515 | 2/1983 | Japan | 437/89 |
| 0054452 | 3/1985 | Japan | 437/89 |

Primary Examiner—Brian E. Hearn
Assistant Examiner—Tuan Nguyen
Attorney, Agent, or Firm—Aaron B. Bernstein

[57] ABSTRACT

One preferred method for making a semiconductor structure includes altering the direction, and optionally the position, of a polycrystalline grain boundary (38) in a base layer (17,21) of an epitaxial base bipolar transistor (10). Altering the grain boundary (38) may be accomplished by annealing the semiconductor structure after the layer, which later forms the lower portion of the base (17), has been deposited. Altering the grain boundary (38) has a significant effect in reducing base resistance ($R_{bx1}$, $R_{bx2}$). Reduced base resistance ($R_{bx1}$, $R_{bx2}$) dramatically improves device performance.

19 Claims, 3 Drawing Sheets

METHOD FOR REDUCING BASE RESISTANCE IN EPITAXIAL-BASED BIPOLAR TRANSISTOR

BACKGROUND OF THE INVENTION

The present invention relates to semiconductor structures, and more particularly to altering the orientation of grain boundaries of certain semiconductor layers.

One particularly useful device in the semiconductor industry, and particularly in the analog radio frequency (RF) device industry, is the epitaxial-base bipolar transistor. In certain configurations, the epitaxial-base bipolar transistor comprises a base portion which includes an epitaxial portion adjacent a polycrystalline portion. A crystal "grain boundary" exists at the interface between the polycrystalline portion and the epitaxial portion of the base. The grain boundary has a particular orientation. The nature of this orientation significantly affects the base resistance ($R_b$) of the device. It is well understood by those skilled in the art that the base resistance effects important performance parameters such as power gain and noise figure, in the case of RF devices. It is desirable to minimize $R_b$.

Consequently, what is needed is a method for affecting/altering the orientation of a grain boundary in a semiconductor layer, and in particular the orientation of a grain boundary in the base of an epitaxial-base bipolar transistor, in order to favorably affect $R_b$.

DETAILED DESCRIPTION OF THE DRAWINGS

Figure 1:
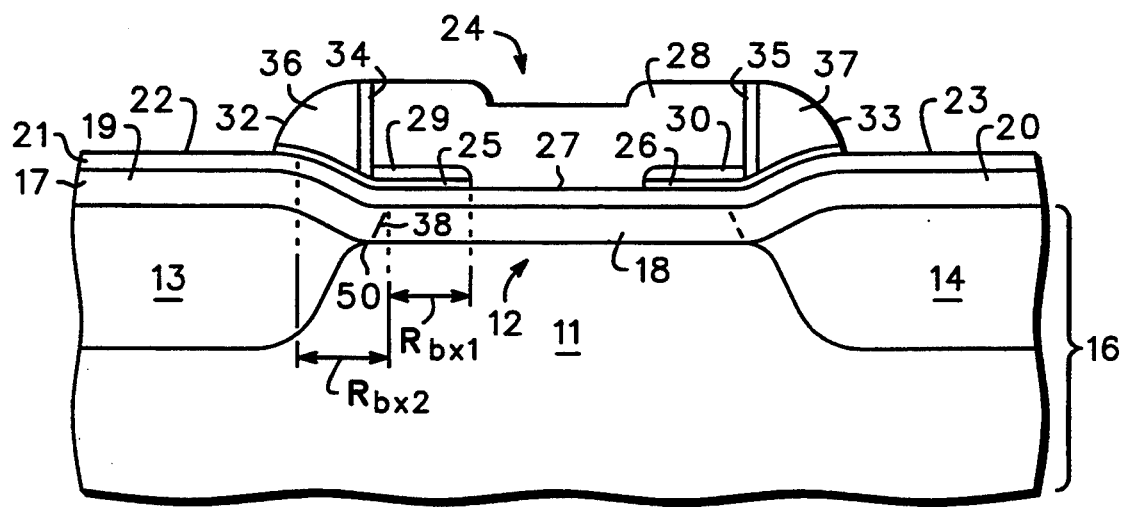
FIG. 1 is a cross-sectional view representing a portion of an epitaxial-base bipolar transistor.

FIG. 1 is a cross-sectional view representing a portion of an epitaxial-base bipolar transistor. FIG. 1 illustrates the structure to which a preferred method in accordance with the present invention is applied, and particularly illustrates the $R_b$ issues outlined in the Background section of the present specification. FIG. 1 illustrates a portion of epitaxial-base bipolar transistor 10. Transistor 10 includes epitaxial-collector portion 11. An active area, generally toward the center of the device as indicated by arrow 12, is defined by forming LOCOS (local oxidation of silicon) oxide isolation regions 13, 14. Isolation regions 13, 14 along with epitaxial-collector portion 11 together comprise underlying structure 16. In order to provide the base of the device, undoped (also called intrinsic) semiconductor layer 17 is deposited over underlying structure 16. Typically, the deposition is performed with well understood low temperature epitaxy (LTE) techniques. In the present application, undoped silicon is deposited using a mixture of silane and hydrogen gases at 800° C. by reduced pressure chemical vapor deposition technique (RPCVD). When undoped semiconductor layer 17 is deposited, an epitaxial portion 18 will tend to form over the epitaxial-collector portion 11, while polycrystalline portions 19, 20 will tend to form over LOCOS isolation portions 13, 14, respectively.

Subsequently, according to typical methods, an in-situ doped base layer 21 is deposited with LTE techniques. The layer can be silicon or silicon-germanium alloy doped with boron as a <P>-type impurity. Germanium and boron are incorporated in the film during RPCVD growth by adding germane and diborane gases to silane and hydrogen. Typical boron concentration is in the $10^{18}$–$10^{19}$ atoms/cm$^3$ range, and germanium content is in the 10–20% atoms/cc range. Base layer 21 will tend to follow the formation of undoped-layer 17 with respect to polycrystalline portions and epitaxial portions, as illustrated by the figure. Later, the dopants in layer 21 may be diffused into undoped layer 17, both layers together serving as the base.

Subsequently, an "emitter stack", indicated generally by arrow 24, is formed. Emitter stack 24 includes oxide isolation portions 25, 26 which define an emitter contact region 27. A polycrystalline emitter 28 is formed, contacting active region 12 at emitter contact region 27. Portions of a polycrystalline emitter 28 are separated from active region 12 with nitride portions 29, 30. Additionally, sidewall spacers 32, 33 are provided along the sides of emitter stack 24, comprising TEOS isolation portions 34, 35 and nitride sidewalls 36, 37, respectively. Spacers 32,33 serve to isolate base contact areas 22,23, respectively, from active area 12, and provide masking for doping and alignment as necessary.

Prior to the formation of emitter stack 24, in a typical device, a thin layer of emitter dopant such as arsenic, may be implanted toward the center of active region 12, into base layer 21.

The structure of FIG. 1 has particular features that are relevant to a method in accordance with the present invention. As previously discussed, one performance parameter which significantly affects the performance of the device is $R_b$. With reference to FIG. 1, the major contributions to $R_b$ are $R_{bx1}$ and $R_{bx2}$. $R_{bx1}$ is the resistance in the epitaxial portion of layers 21 and 17 lying between the tip of the polycrystalline region 19 and the emitter contact region 27, as indicated in FIG. 1. $R_{bx2}$ is the resistance in the polycrystalline portions of layers 21 and 17 beneath the emitter stack, as indicated in FIG. 1.

Although it is desirable to minimize $R_b$, and therefore $R_{bx1}$ and $R_{bx2}$, several factors limit minimizing these parameters. For example, $R_b$ could be decreased if the dopants implanted in regions 22,23 (which provides conductive contact to the base) could reach at least the $R_{bx2}$ region. However, the polycrystalline nature of regions 19,20 prevent lateral diffusion of the dopants toward active area 12. Furthermore, the fact the $R_{bx2}$ comprises polycrystalline material rather than epitaxial material increases base resistance. Additionally, the length of $R_{bx1}$ combined with $R_{bx2}$, which bears directly on $R_b$, must be sufficient to provide at least 0.3 microns between the tip of grain boundary 38 and emitter region 27, i.e., the distance between the dotted lines indicating $R_{bx1}$. It is understood by those skilled in the art that this minimum distance is required to avoid undesired emitter/base leakage current.

For the purposes of clarity and simplicity, the following discussions of preferred methods focus on only one half (the left half) of the device. It will be understood that the concepts apply symmetrically to both sides.

According to a preferred method consistent with the present invention, one solution for reducing $R_b$ is to anneal undoped-layer 17 once it has been deposited, in order to alter the orientation of the grain boundary 38 of polycrystalline portion 19. As discussed previously, when undoped-layer 17 is initially deposited, a grain boundary originates at the interface between LOCOS isolation region 13 and collector epitaxial portion 11. It is well understood by those skilled in the art that LOCOS isolation region 13 tends to form a pointed "bird's beak" 50 at its edge near active region 12. When undoped-layer 17 is deposited, grain boundary 38 forms, originating at edge 50. Due to the downward sloping direction of LOCOS region 13 near edge 50, grain boundary 38 will tend to extend inward, toward the center of active region 12.

Figure 2:
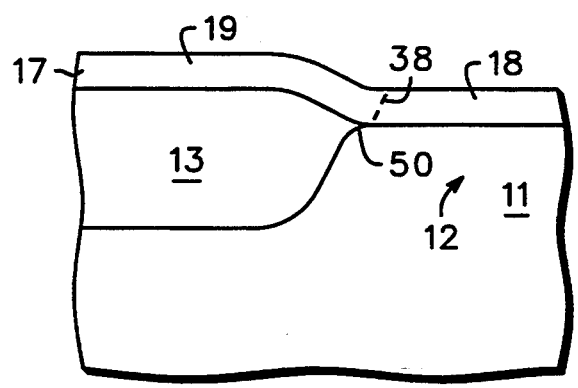
FIGS. 2-5 are cross-sectional views representing a portion of an epitaxial-base bipolar transistor at respective stages during fabrication.

Referring to FIG. 2, according to a preferred method, after collector epitaxial region 11 is formed and LOCOS isolation structure 13 is formed, undoped-layer 17 is deposited using LTE techniques to a thickness of approximately 1,000–2,000 angstroms. Silane gas may be used in order to form a seed layer over LOCOS regions 13, to provide for the formation polycrystalline portion 19.

Figure 3:
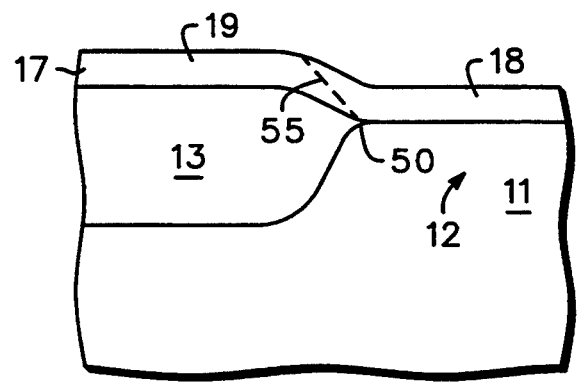

After layer 17 is deposited, an anneal is performed at a relatively high temperature, on the order of greater than 1,000° C. in order to recrystallize the polycrystalline silicon regions of layer 17 (portions 19, 20), thereby altering the orientation of grain boundary 38. This leads to the structure shown in FIG. 3.

Grain boundary 38 has been altered by annealing, and new grain boundary 55 has been formed. Grain boundary 55 now points away from active region 12, rather than toward active region 12, as was the case with grain boundary 38. Note, that according to the presently described method, the origin of grain boundary 55 remains substantially at edge 50 of LOCOS region 13.

Figure 4:
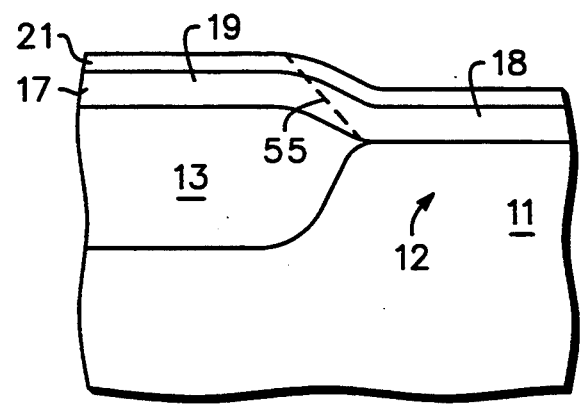
Figure 5:
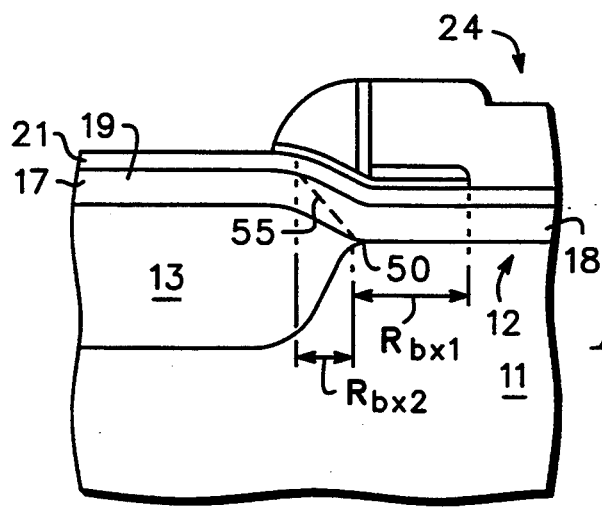

Turning to FIG. 4, base layer 21 is grown with LTE techniques. Typically, base layer 21 is in-situ doped Si or SiGe alloy. Note that the polycrystalline faceting of layer 21 tends to follow that of layer 17, as indicated by the extension of grain boundary 55. Turning to FIG. 5, emitter stack 24 is subsequently formed according to well known methods.

An important advantage of the method just described, is that the length of $R_{bx2}$ has been significantly reduced. The length of $R_{bx1}$ must remain approximately 0.3 microns in order to prevent emitter/base leakage, as discussed above. However, since grain boundary 55 now points away from active region 12, rather than toward active region 12, the length of $R_{bx2}$ has been significantly reduced. In some devices, this reduction may be as much as 50% of the original length of $R_{bx2}$. Consequently, the overall length of $R_b$ has been reduced, resulting in a significant reduction in the magnitude of $R_b$.

Figure 6:
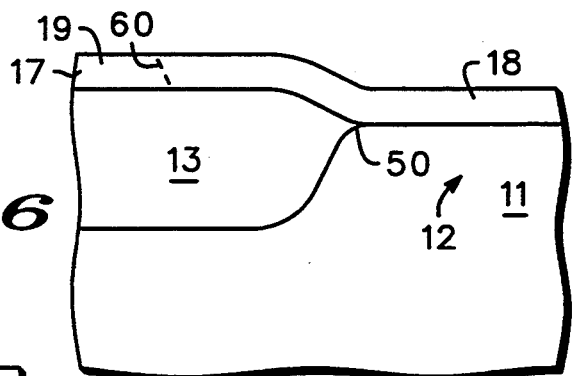
FIGS. 6-8 are cross-sectional views representing a portion of an epitaxial-base bipolar transistor at respective stages of fabrication according to an alternate fabrication method.
Figure 7:
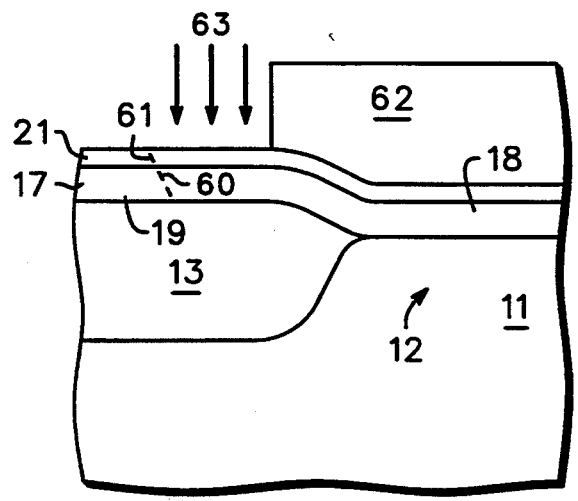
Figure 8:
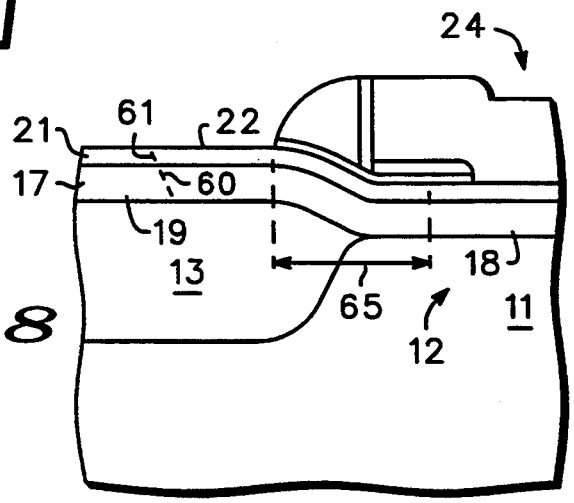

An alternate method in accordance with the present invention is illustrated by FIGS. 6–8. This alternate method is similar to the previously discussed method. However, undoped-layer 17 is recrystallized with a more extreme anneal in order to relocate the polycrystalline grain boundary a substantial distance from active area 12. This method provides the added benefits of a further reduced extrinsic base resistance $R_b$ because the grain boundary 60 is no longer between a surface contact to the base (area 22 in the completed device) and the active area 12. Additionally, because grain boundary 60 is moved a substantial distance away from active region 12, dopant which is implanted in order to enhance contact to the base may laterally diffuse closer to active region 12.

More specifically, this process is carried out as follows. Referring to FIG. 6, undoped-layer 17 is deposited according to the methods previously discussed. Subsequently, undoped-layer 17 is annealed as in the previous method, but at a much high temperature and for a longer period of time, typically 1150° C. and 3 minutes, in order recrystallize most of undoped-layer 17. The result is that single crystalline portion 18 is substantially extended in a direction away from active region 12, and therefore grain boundary 60 is pushed away from active region 12.

Referring to FIG. 7, similar to the method previously discussed, an in-situ doped Si or SiGe base layer is deposited using the previously discussed methods. As illustrated by FIG. 7, a grain boundary 61 of base layer 21 naturally follows grain boundary 60 of undoped-layer 17. Consequently, the entire portion to the right of grain boundaries 60,61 is substantially single crystalline.

Following the deposition of layer 21, mask portion 62 is provided using well known photolithographic methods. Subsequently, an extrinsic dopant such as boron is implanted in the region indicated by arrows 63, in order to provide an effective contact to the base of the device.

Moving to FIG. 8, mask 62 has been removed according to well known processes, and emitter stack 24 has been formed. One notable feature illustrated by FIG. 8 is region 65, across which the implant indicated by 63 in FIG. 7 has been able to laterally diffuse during the processing associated with emitter stack 24. This lateral diffusion provides the benefits discussed earlier, of a lower $R_b$, compared to a structure where a grain boundary lies under the emitter stack, thus preventing such lateral diffusion of dopants.

Figure 9:
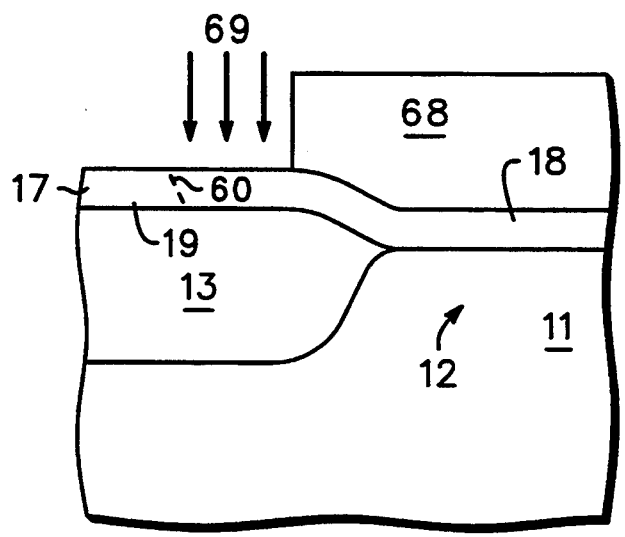
FIGS. 9-11 are cross-sectional views representing a portion of an epitaxial-base bipolar transistor at respective stages of processing according to yet another method of manufacture.
Figure 10:
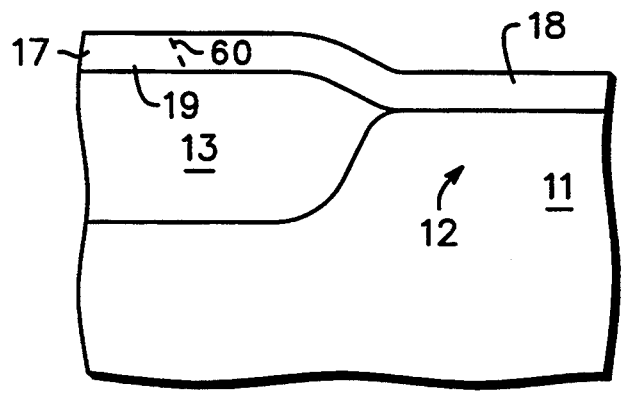
Figure 11:
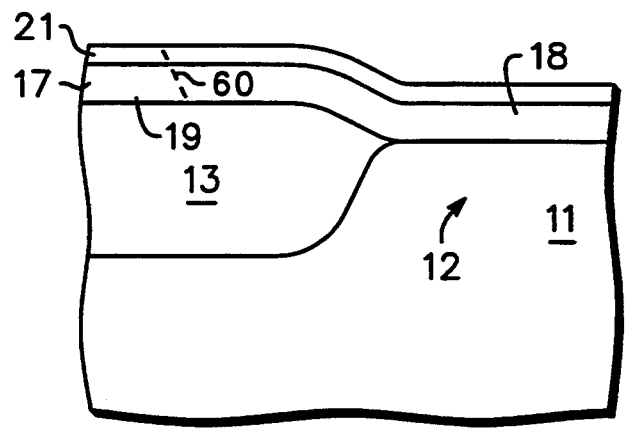

A third method in accordance with the present invention is illustrated in FIGS. 9–11. This method takes into account the concern of dislocations propagating toward active area 12 due to dopant implants (such as that indicated by 63 in FIG. 7). According to this alternative method, undoped-layer 17 is deposited as in the previously discussed methods. Subsequently, undoped-layer 17 is annealed, as in the most previously discussed method, in order to substantially relocate grain boundary 60 away from active region 12.

According to the presently discussed method, following the anneal of layer 17, an implant step is performed. As illustrated in FIG. 9, mask 68 is formed according to well known photolithographic methods. Subsequently, a dopant is implanted, as indicated by arrows 69. The dopant provides an effective base contact for the device, and may be boron, as is well understood by those skilled in the art.

Moving to FIG. 10, following the doping step, the structure is annealed in order to activate the dopant, laterally diffuse the dopant toward active region 12, and importantly, anneal away crystalline defects. Turning to FIG. 11, base layer 21 is formed. Subsequently, emitter stack 24 is fabricated, resulting in a structure very similar to that illustrated in FIG. 8. The significant difference between this method and the most previously discussed method is that the extrinsic dopant implantation, which provides effective base contact for the device, occurs before the deposition of base layer 21, rather than after. Additionally, an anneal which activates and laterally diffuses the dopant, and removes defects, is performed. The removal of defects is particularly important when the base comprises epitaxial SiGe. SiGe is a pseudomorphic epitaxial strained layer and consequently mechanically fragile. Defects from the underlying layer can generate dislocations in the SiGe layer which will propagate in the active area during subsequent processing steps. Such defects tend to cause undesirable emitter/base electrical leakage.

As will be appreciated by now, new methods in accordance with the present invention are provided to reduce the base resistance, $R_b$, in devices such as epitaxial-base bipolar transistor structures. Among other advantages, grain boundaries are altered or moved in order to substantially the reduce base resistance.

While specific illustrative methods have been shown, obvious modification and improvements will naturally occur to those skilled in the art. Consequently, it should be understood that this invention is not limited to the particular methods shown and discussed, and that the appended claims cover all modifications that do not depart from the spirit and scope of this invention.

We claim:

1. A method for reducing base resistance in an epitaxial-based bipolar transistor comprising the steps of:
providing an underlying structure comprising an epitaxial collector region and an adjacent isolation region, the epitaxial collector region meeting the isolation region at an interface;
forming a semiconductor base layer over the underlying structure, the semiconductor base layer including a grain boundary originating at the interface, the grain boundary having an orientation, the grain boundary defining a single crystal portion of the semiconductor base layers; and
laterally extending the single crystal portion of the semiconductor base layer by altering the orientation of the grain boundary, thereby reducing the base resistance of the epitaxial-base bipolar transistor.

2. The method of claim 1, further comprising the step of forming an in-situ doped base layer over the semiconductor base layer.

3. The method of claim 1, further comprising the step of forming an emitter overlying the semiconductor base layer.

4. The method of claim 1, wherein the grain boundary has an origin at the interface, wherein the grain boundary orientation has a direction, and wherein the step of altering comprises changing the grain boundary direction without moving the grain boundary origin.

5. The method of claim 1, wherein the grain boundary has an origin at the interface, wherein the grain boundary orientation has a direction, and wherein the step of altering changes the direction and moves the origin.

6. The method of claim 5, further comprising the steps of forming an in-situ doped base layer over the semiconductor a layer, forming a mask over the central portion of the in-situ doped base layer, and implanting impurities into the in-situ doped base layer and the semiconductor base layer.

7. The method of claim 5, further comprising the steps of forming a mask over a central portion of the semiconductor layer, implanting impurities into the semiconductor base layer and annealing the semiconductor base layer.

8. The method of claim 7, further comprising the steps of forming an in-situ doped base layer over the semiconductor base layer and forming an emitter over the in-situ doped base layer.

9. The method of claim 1, wherein the step of altering comprises annealing the semiconductor base layer.

10. A method for reducing base resistance in an epitaxial-base bipolar transistor comprising the steps of:
providing an underlying structure comprising a collector region having a center, and an isolation region;
depositing a intrinsic base layer over the underlying structure, the intrinsic base layer comprising an epitaxial portion and a polycrystalline portion, the polycrystalline portion comprising a grain boundary extending toward the center of the collector region; and
reducing the base resistance in the epitaxial-base bipolar transistor by altering the grain boundary of the polycrystalline portion such that the grain boundary extends away from the center of the collector region.

11. The method of claim 10, wherein the step of altering comprises annealing the intrinsic base layer.

12. The method of claim 11, wherein the grain boundary has an origin and wherein the step of altering does not move the origin.

13. The method of claim 11, wherein the grain boundary has an origin and wherein the step of altering moves the origin.

14. The method of claim 10, further comprising the step of implanting impurities into the intrinsic base layer followed by the step of depositing an in-situ doped base layer over the intrinsic base layer.

15. The method of claim 10, further comprising the step of depositing an in-situ doped base layer over the intrinsic base layer followed by implanting impurities into the in-situ doped base layer.

16. A method for reducing a base resistance in an epitaxial-base bipolar transistor comprising the steps of:
depositing a collector epitaxial layer;
forming an oxide isolation region having an edge;
depositing an undoped base layer including an epitaxial portion and a polycrystalline portion, the polycrystalline portion having a grain boundary;
reducing the base resistance of the epitaxial-base bipolar transistor by annealing the undoped base layer to alter the grain boundary of the polycrystalline portion;
depositing an in-situ doped base layer over the undoped base layer; and
forming an emitter layer overlying the in-situ doped base layer.

17. The method of claim 16, wherein the oxide isolation region comprises LOCOS, and wherein the edge is pointed.

18. The method of claim 16, wherein the grain boundary has an origin at the oxide isolation region edge prior to and after the step of annealing, and wherein the step of annealing causes the grain boundary to move from a direction toward the center of the semiconductor structure to a direction away from the center of the semiconductor structure.

19. The method of claim 16, wherein the grain boundary has an origin located at the oxide isolation region edge prior to the step of annealing and located at a second location after the step of annealing.

* * * * *

UNITED STATES PATENT AND TRADEMARK OFFICE
CERTIFICATE OF CORRECTION

PATENT NO. : 5,436,180
DATED : July 25, 1995
INVENTOR(S) : de Fresart et al.

It is certified that error appears in the above-indentified patent and that said Letters Patent is hereby corrected as shown below:

Column 5, claim 1, line 33, delete "layers;" and insert therefore --layer,;--.

Column 5, claim 6, line 57, delete the first occurrence of "a" and insert therefore --base--.

Signed and Sealed this

Sixteenth Day of January, 1996

Attest:

BRUCE LEHMAN

Attesting Officer

Commissioner of Patents and Trademarks